United States Patent [19]

Ikawa et al.

[11] Patent Number: 4,663,646
[45] Date of Patent: May 5, 1987

[54] GATE ARRAY INTEGRATED CIRCUIT USING SCHOTTKY-BARRIER FETS

[75] Inventors: Yasuo Ikawa, Tokyo; Nobuyuki Toyoda, Yokohama; Katsue Kanazawa, Yokohama; Takamaro Mizoguchi, Yokohama; Akimichi Hojo, Yokohama, all of Japan

[73] Assignee: Kabushiki Kaisha Toshiba, Kawasaki, Japan

[21] Appl. No.: 674,869

[22] Filed: Nov. 26, 1984

[30] Foreign Application Priority Data

Jan. 20, 1984 [JP] Japan ................................ 59-7964

[51] Int. Cl.$^4$ ............................................. H01L 27/04
[52] U.S. Cl. ........................................ 357/45; 357/41; 357/68; 357/71
[58] Field of Search ........................ 357/45, 71, 41, 68

[56] References Cited

U.S. PATENT DOCUMENTS 3,808,475 4/1974 Buelow et al. ......................... 357/45

OTHER PUBLICATIONS

Japanese Journal of Applied Physics, vol. 22, Supplement 22-1, p. 345, "500 Gates GaAs Gate Array"; N. Toyoda et al.; 1983.
Technical Digest, 1983 GaAs IC Symposium, p. 178,
"A High Yield GaAs Gate Array Technology and Applications"; A. Rode et al.; Oct., 1983.
Technical Digest, 1983 Custom Integrated Circuits Conference, p. 32, "A 432-Cell GaAs SDFL Gate Array with On-Chip 64-Bit RAM"; T. Vu. P. Roberts et al.; May, 1983.

Primary Examiner—William D. Larkins
Attorney, Agent, or Firm—Oblon, Fisher, Spivak, McClelland & Maier

[57] ABSTRACT

A gate array integrated circuit in which gate cells are each composed of a DCFL circuit using Schottky-barrier FETs. A plurality of basic gate cells is arrayed in one direction to form a basic cell array, and such basic cell arrays are arranged parallel to each other. VDD lines and GND lines are provided to apply an operating voltage to the basic gate cells. In order to stably operate the gate array integrated circuit of DCFL structure in which the logical amplitude and noise margin are small, the VDD lines and the GND lines are arranged perpendicular to each other such that the number of the basic gate cells which are connected to each of the VDD lines is larger than that of the basic gate cells which are connected to each of the GND lines. According to this layout, the potential difference (voltage drop) developed in the GND lines by operation current is reduced.

11 Claims, 8 Drawing Figures

GATE ARRAY INTEGRATED CIRCUIT USING SCHOTTKY-BARRIER FETS

BACKGROUND OF THE INVENTION

The present invention relates to a gate array integrated circuit and, more particularly, to a direct-coupled FET logic (DCFL) gate array using Schottky-barrier FETs.

In the field of Si MOS and bipolar ICs, gate array integrated circuits (ICs) have been developed and commercially available as semi-custom ICs. With such ICs, a master, which constitutes a main part of a device and includes a plurality of basic gates, is fabricated in advance, and by designating the interconnection of the gates in accordance with the specifications of the users, ICs having the desired logical function can be fabricated. In this case, only an interconnection process remains as a manufacturing process after the user specifications are determined, thereby offering a relatively fast production.

A method for realizing high-speed operation and low power dissipation of a gate array IC is to lower the power supply voltage and to minimize a logic swing. In MOS ICs, when the power supply voltage is lowered, the operation speed is decreased. On the other hand, bipolar ICs are difficult to operate at a power supply voltage of about one volt. A circuit utilizing Schottky-barrier FETs (metal-semiconductor field-effect transistors: MESFETs) is known as a circuit which can be operated with a low power supply voltage and a small logic swing. Gate arrays composed of the Schottky-barrier FETs can occupy an independent field as high-speed and low power dissipation gate arrays.

A so-called direct coupled FET logic (DCFL) is known as a basic circuit of a Schottky-barrier FET gate array. This basic circuit uses a normally-on MESFET (i.e., a depletion-mode FET, abbreviated DFET) as a load and a normally-off MESFET (an enhancement-mode FET, abbreviated EFET) as a driver. A resistor may be used as the load in place of a DFET.

In the case of DCFL, the noise margin becomes small because of a small logic swing. Therefore, for example, great care must be taken in designing a master portion in comparison to an Si gate array using a CMOS circuit as a basic cell.

ICs having a gate array fabricated on a GaAs crystal have been reported as the Schottky-barrier FET gate array IC.

In a conventional DCFL GaAs gate array, power supply (VDD) lines and ground (GND) lines coupled to each basic cell are disposed in parallel with each other. (For examples, see the paper by N. Toyoda et al, "500 gates GaAs Gate Array," Proc. 14th Conf. on Solid State Devices, Tokyo, 1982 in Jap. J. Appl. Phys. 22 (1983), Supplement 22-1, pp. 345-348, or the paper by N. Toyoda et al, "Capability of GaAs DCFL for High-Speed Gate Array," Technical Digest, 1982, IEDM, p. 602.)

This is attributed to the following reasons. Generally, the gate width of each FET in a basic cell is made longer than the gate length. For this reason, each basic cell is shaped into a rectangle having a long side along the gate width direction of the FETs. It is desired, therefore, that input and output lines of the basic cell be arranged to extend from a short side of the basic cell, and interconnection tracks for interconnection to the gates of FETs be formed along the short side of the basic cell. Therefore, the basic cells are arrayed such that the long sides of adjacent basic cells are contiguous to each other, thereby forming a cell array (column). On the other hand, the VDD and GND lines must not be arranged to run across the interconnection tracks. This is to avoid manufacturing complexity and to improve manufacturing yield. For this reason, the VDD and GND lines are arranged along the basic cell array.

Such a conventional layout of the VDD and GND lines is no problem in Si-MOS and bipolar ICs with a relatively large logic swing, low-speed ICs, and GaAs gate array ICs having a relatively small number of gates, for example, 500.

However, the present inventors have found that if the conventional layout of the VDD and GND lines as described above is used in the DCFL gate array using Schottky-barrier FETs, a potential difference is produced by a supply current in the VDD and GND lines due to the resistance components thereof, thereby increasing the ground voltage level enough to prevent a correct circuit operation. Particularly, this becomes remarkable when realizing a GaAs gate array having, for example, 1,000 gates or more.

A GaAs gate array having the VDD and GND lines which are arranged perpendicular to each other has been reported (see the paper by A. Rode et al, "A High Yield GaAs Gate Array Technology and Applications," Technical Digest, 1983, GaAs IC Symposium, p. 602). In this gate array, the GND line runs along the basic cell array and the VDD line runs perpendicular to the basic cell array. Particularly, the GND line is realized by airbridge technology to run over the basic cell. The VDD line is realized by a first level interconnection line. Generally, the number of basic cell arrays is smaller than that of the basic cells of each basic cell array. Therefore, in the conventional gate array, the number of the basic cells coupled to one VDD line is smaller than that of the basic cells coupled to one GND line. Since the conventional gate array is fabricated by a complex technique such as airbridge, manufacturing yield is undesirably degraded. If the airbridge technique is not used, a GND line region using a second level interconnection line needs to be arranged adjacent to and parallel to the cell array. This is to prevent the threshold values of FETs from shifting which occurs when the GND line region runs over the FET gates. Further, since signal interconnection lines which run across the cell array must be first level interconnection lines, a region therefor is needed in the cell. In any case, the arrangement of GND line along the column (cell array) results in an increase in the cell area.

SUMMARY OF THE INVENTION

It is an object of the present invention to provide an improved gate array IC using Schottky-barrier FETs which is easy to fabricate.

It is another object of the present invention to provide a gate array IC in which each basic gate cell has a DCFL configuration of Schottky-barrier FETs and which stably operates.

It is still another object of the present invention to provide a gate array IC wherein a plurality of basic cell arrays each having a plurality of basic gate cells is arranged parallel to each other, wherein each basic cell has a DCFL configuration of Schottky-barrier FETs, and wherein VDD and GND lines are coupled to each basic cell, and which is arranged to lower a voltage drop which occurs in the GND line during operation.

A gate array IC according to the present invention comprises an integrated circuit substrate; a gate array which is fabricated on the integrated circuit substrate and has a plurality of basic cell arrays (column) arranged parallel to each other and each having a plurality of basic gate cells, each of the basic gate cells consisting of Schottky-barrier field effect transistors; and a plurality of power supply lines and a plurality of ground lines, which are both connected to the basic cells for supplying an operating voltage thereto, each of the power supply lines and the ground lines being commonly coupled to a plurality of basic gate cells, and the power supply lines and the ground lines being arranged perpendicular to each other.

In accordance with this invention, in order to achieve the above objects of the present invention, the power supply lines and ground lines are arranged perpendicular to each other such that the number of the basic gate cells which are connected to each of the power supply lines is larger than that of the basic gate cells which are connected to each of the ground lines.

In a gate array in which the number of the basic gate cells of each of the basic cell arrays (columns) is larger than that of the basic cell arrays, the power supply lines are arranged parallel to the basic cell arrays, and the ground lines are arranged perpendicular thereto. On the other hand, in a gate array in which the number of basic gate cells of each of the basic cell arrays is smaller than that of the basic cell arrays, the power supply lines are arranged perpendicular to the basic cell arrays. According to this arrangement, a current flowing through each of the ground lines can be reduced in comparison to that of a conventional gate array in which power supply lines are parallel to ground lines so that a voltage drop in the ground line may be reduced.

According to a preferred embodiment of the present invention, the ground lines are realized by uppermost-level interconnection metallization lines which are formed perpendicular to the columns. In other words, even if the ground lines run across the interconnection tracks, signal lines which are provided in the interconnection tracks can be realized by first level interconnection lines. Signal lines which run across the columns can be realized in parallel to the ground lines by the uppermost-level interconnection lines. In this manner, the gate array IC according to the present invention can be easily fabricated using a conventional semiconductor fabrication technique, thereby providing a high manufacturing yield.

According to the present invention, since the increase in a potential in the ground lines connected to the DCFL basic gate cells using the Schottky-barrier FETs can be suppressed, the normal operation of the high-density integrated gate array can be achieved. The present invention may be applied to a DCFL gate array integrated circuit using Schottky-barrier FETs which are formed on either GaAs or Si substrate.

DETAILED DESCRIPTION OF THE PREFERRED EMBODIMENT

The present invention will be described with reference to a GaAs gate array.

Figure 1:
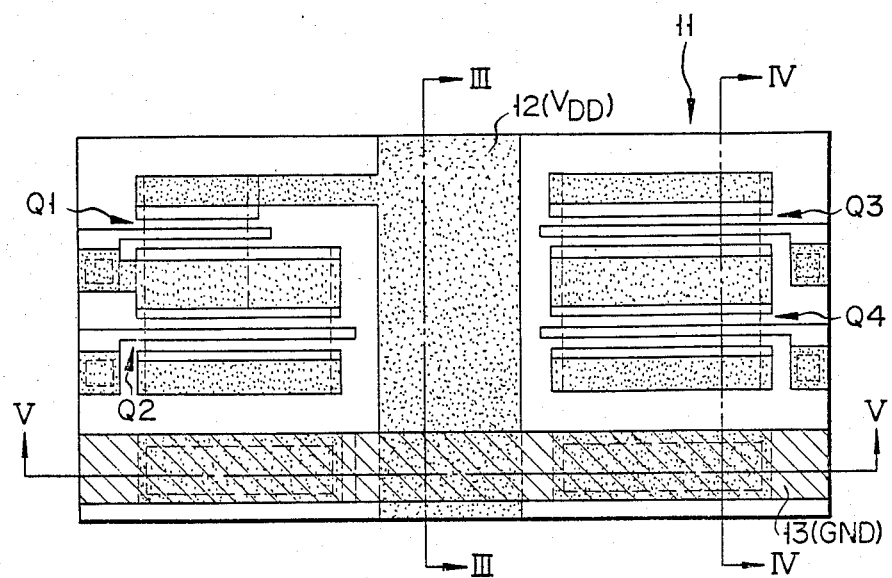
FIG. 1 shows a layout of a basic gate cell of a gate array integrated circuit embodying the present invention.

Referring now to FIG. 1, a layout of a basic gate cell 11 of the GaAs gate array is shown, which consists of a DCFL circuit composed of one DFET Q1 and three EFETs Q2 to Q4. As shown in FIG. 1, the basic gate cell 11 has a rectangular shape. A power supply (VDD) line 12 is disposed along the short side of a rectangle at a central portion of basic gate cell 11 between FETs Q1 and Q2, and FETs Q3 and Q4. A ground (GND) line 13 is disposed perpendicular to VDD line 12, that is, along the long side of the rectangle at a lower portion of gate cell 11. Each of the gates of FETs Q1 to Q4 is disposed to extend along the long side of the rectangle. The VDD line 12 is connected to the drain of DFET Q1.

Figure 2:
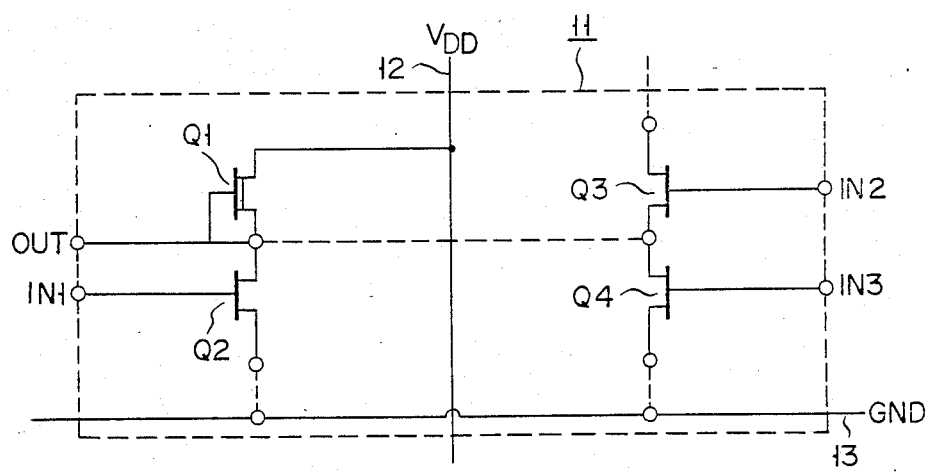
FIG. 2 is an equivalent circuit diagram of the basic gate cell of FIG. 1.

FIG. 2 shows an equivalent circuit of basic gate cell 11. The basic gate cell 11 can be operated as a 3-input NOR gate composed of FETs Q1 to Q4 or an inverter composed of FETs Q1 and Q2 by proper interconnection. Interconnection as indicated by the dotted lines in FIG. 2 is performed in accordance with user specifications at an interconnection step. The source of FET Q3 is connected to a GND line in an adjacent cell (not shown).

A basic cell column is composed by arraying a plurality of basic cells 11 along a longitudinal direction. Therefore, VDD line 12 runs along the column, and on the other hand, GND line 13 runs perpendicular to the column. A plurality of columns is arranged parallel to each other. Interconnection tracks are laid out between two adjacent columns so as to connect signal lines to the gates of FETs constituting the gate cell.

Figure 6:
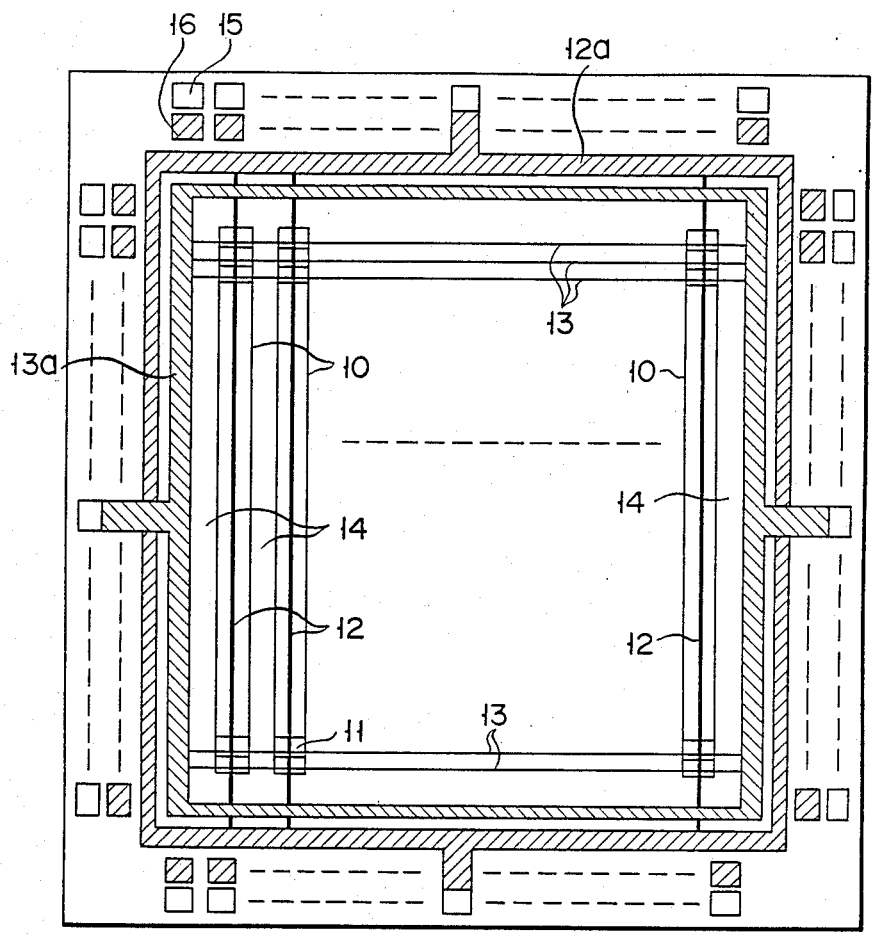
FIG. 6 shows a pattern of a gate array chip using the basic gate cells of FIG. 1.

FIG. 6 shows a pattern of a gate array chip tentatively fabricated using the above layout method. As described above, a plurality of basic cell columns 10 is arranged parallel to each other, and the interconnection tracks 14 are laid out therebetween. In each column 10, VDD line 12 runs in parallel to column 10, and GND line 13 runs perpendicular to column 10. VDD and GND lines 12 and 13 in the cell array region are respectively connected to VDD and GND lines 12a and 13a which are disposed on the periphery of the cell array region. Furthermore, bonding pads 15 and I/O cells 16 are laid out outside VDD and GND lines 12a and 13a. This gate array is composed of 14 columns each having 75 basic cells. Thus, 1,050 gates are integrated on a chip. In column 10, VDD line 12 is realized by a 13 μm-wide first level interconnection line, and GND line 13 is realized by a 4 μm-wide second level interconnection line.

Figure 3:
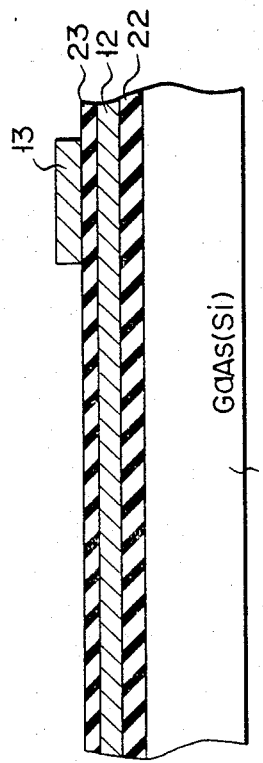
FIGS. 3 to 5 are respectively sectional views taken along lines III—III, IV—IV and V—V of FIG. 1.

The manufacturing process for the above gate array will be described with reference to FIGS. 3 to 5 hereinafter. This manufacturing process is basically the same as those described in the above-described papers (1) and (2). FIG. 3 is a sectional view of the basic cell of FIG. 1 taken along the line III—III. An insulating film 22 such as an $SiO_2$ film is formed on a semi-insulating GaAs substrate 21. VDD line 12 consisting of a first level interconnection line is formed on insulating film 22. VDD line 12 is covered with an insulating interlayer 23 such as an SiO$_2$ film. GND line 13 consisting of a second level interconnection line is formed on interlayer 23. Each of the first and second level interconnection lines has a three-layer structure of Ti-Pt-Au. Basically, in the first level interconnection line, the Ti, Pt and Au layers are about 50 nm, 100 nm and 150 nm in thickness, respectively. On the other hand, in the second level interconnection line, the Ti, Pt and Au layers are about 50 nm, 100 nm and 1,000 nm in thickness, respectively. Since the second level interconnection line can be formed thicker than the first level interconnection line, the sheet resistance of the second level interconnection line can be lowered. In the above example, the sheet resistance of the first level interconnection line is 0.14 Ω/square, and that of the second level interconnection line is 0.023 Ω/square.

Figure 4:
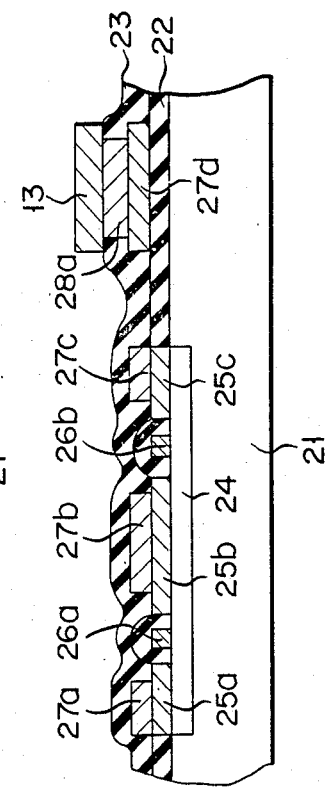

FIG. 4 is a sectional view of FIG. 1 taken along line IV—IV. An ion-implanted conductive region 24 for forming an active region including the source and drain regions of EFETs Q3 and Q4 is formed adjacent to a major surface of GaAs substrate 21. Naturally, EFET and DFET are formed under different ion-implantation conditions. Reference numerals 25a, 25b and 25c denote ohmic metal layers made of a metal such as gold and germanium alloy; and 26a and 26b, Schottky gate electrode layers made of a metal such as platinum. Conductive layers 27a, 27b and 27c of the first level interconnection line are formed on the ohmic metal layers 25a, 25b and 25c, respectively. GND line 13 on insulating film 23 is electrically connected to a conductive layer 27d of the first level interconnection line formed on insulating layer 22 through a via metal (through hole metal) layer 28a made of a metal such as gold. The conductive layers 27c and 27d are not electrically connected in FIG. 4, but are connected as needed in an interconnection step, so that the drain of FET Q4 is connected to GND line 13.

Figure 5:
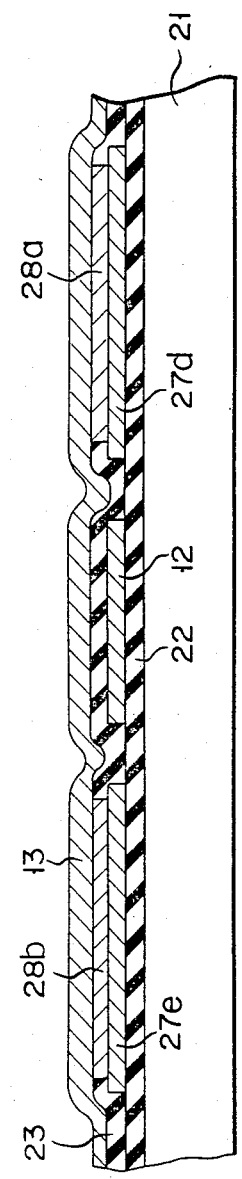

FIG. 5 is a sectional view of FIG. 1 taken along line V—V. In the same manner as in FET Q4, in order to connect the drain of FET Q2 to GND line 13, GND line 13 is connected to a conductive layer 27e through a via metal layer 28b.

Resistances per unit length of VDD and GND lines 12 and 13 in the cell array region are 10 Ω/mm and 5.75 Ω/mm, respectively. Although GND line 13 has a smaller width than VDD line 12, it has a smaller resistance per unit length than VDD line 12. On the other hand, the number of basic cells connected to GND line 13 is 14, while the number of basic cells connected to VDD line 12 is 75. This means that a current flowing through GND line 13 is smaller by a factor of 75/14 or by 5.4 of that flowing through VDD line 12. It can be understood, therefore, that the above layout method is effective for suppressing a potential elevation in GND line 13 due to the current flowing therethrough, in addition to the small resistance per unit length thereof.

Let us estimate the maximum value of the potential difference (voltage drop) developed in each of VDD and GND lines 12 and 13 of the layout of this embodiment. Assume that the gate width (μ)/gate length (μ) ratios of the active load DFET and the driver EFET of the basic cell are 10/1 and 20/1, respectively, and typical saturated drain currents of the DFET and the EFET are 0.8 mA and 1.6 mA, respectively. In the case of VDD line 12, the maximum voltage drop is developed when all the DFETs connected thereto are turned on. In the case of GND line 13, the maximum voltage drop is developed when all the EFETs connected thereto are turned on. However, the current amount of GND line 13 is limited by the DFETs. As a result, the GND line current due to a basic cell is the same as the VDD line current due to a basic cell. In view of the symmetry of the layout, the maximum potential differences with respect to the VDD and GND potentials occur at the centers of VDD and GND lines 12 and 13, respectively.

Figure 7:
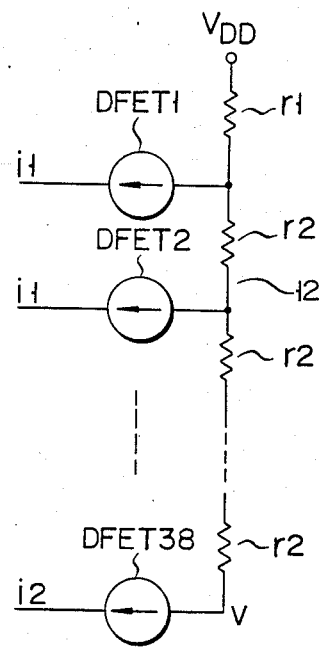
FIG. 7 is a view for calculating a maximum potential difference of VDD lines of FIG. 6.

Referring to FIG. 7, the maximum potential difference developed in VDD line 12 may be calculated as follows. DFET1 to DFET38 indicate that each of 38 basic cells serves as a current sink when the corresponding DFET is turned on. The current amount of each DFET is i1=0.8 mA except i2=0.4 mA for DFET38 corresponding to the central cell of the column. The VDD line 12 has resistance r2 of 0.34 Ω between two adjacent current sinks, and resistance r1 of 2 Ω at the VDD end. Therefore, the potential difference VDD-V isexpressed as follows:

$$VDD - V = 0.4 \,[mA] \times 0.34 \,[\Omega] + (0.4 + 0.8) \,[mA] \times \\ 0.34 \,[\Omega] + (0.4 + 0.8 \times 2) \,[mA] \times 0.34 \,[\Omega] + \ldots + \\ (0.4 + 0.8 \times 36) \,[mA] \times 0.34 \,[\Omega] + (0.4 + 0.8 \times 37) \,[mA] \times$$

$$2 \,[\Omega] = 0.34 \,[\Omega] \times \sum_{j=0}^{36} (0.4 + 0.8j) \,[mA] + 2 \,[\Omega] \times$$

$$(0.4 + 0.8 \times 37) \,[mA]$$

Figure 8:
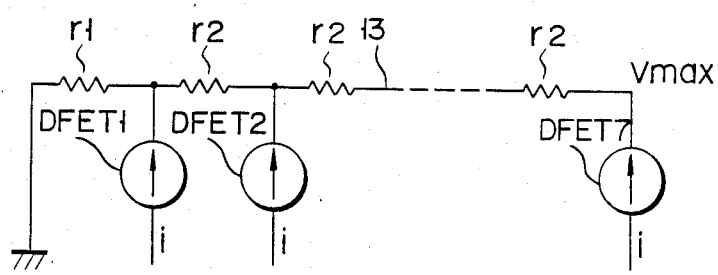
FIG. 8 is a view for calculating a maximum potential difference of GND lines.

Referring to FIG. 8, the maximum potential difference developed in GND line 13 may be calculated as follows. DFET1 to DFET7 indicate that each of seven basic cells serves as a current sink when the corresponding DFET is turned on. The current value i of each cell is 0.8 mA. The GND line has resistance r2 of 1 Ω between the two adjacent current sinks, and resistance r1 of 0.7 Ω at the GND end. Therefore, the maximum potential Vmax is expressed as follows:

$$V_{max} = 0.8 \,[mA] \times 1.0 \,[\Omega] + (0.8 \times 2) \,[mA] \times \\ 1.0 \,[\Omega] + \ldots + (0.8 \times 6) \,[mA] \times 1.0 \,[\Omega] +$$

$$(0.8 \times 7) \,[mA] \times 0.7 \,[\Omega] = 1.0 \,[\Omega] \times \sum_{j=1}^{6} (0.8 \times j) \,[mA] +$$

$$0.7 \,[\Omega] \times (0.8 \times 7) \,[mA] = 25 \,[mV]$$

In this manner, in the worst case, the potential differences of 0.25 V and 25 mV appear in the VDD and GND lines, respectively. In the DCFL structure, a current flows from a previous stage due to the clamp effect of the driver EFETs, contributing to the potential difference. This current is limited by the DFET of the previous stage and therefore has a maximum value of 0.8 mA. A current only twice the above may flow even in the worst case due to the clamp effect. In this case, the maximum potential difference in the GND line is 50 mV.

In the DCFL structure, a low level VL is usually lower than 0.2 V and a high level VH is usually higher than 0.4 V. VL has a minimum value of 0 V, and VH has a maximum value of VDD. A noise margin at the high level can be increased in accordance with the increase in the power supply voltage VDD. However, a noise margin at the low level is 0.2 V. When the layout according to the present invention is used, the potential difference developing in the GND line can be reduced to 50 mV in the worst case. If the GND line is disposed in the same direction as the VDD line and realized by the first level interconnection line with the same width as the VDD line, the potential difference becomes 0.25 V which is equal to that of the VDD line, or becomes 0.5 V in the worst case due to the clamp effect. This means that, since the noise margin at the low level is 0.2 V, the gate array cannot be operated. In order to obtain the same potential difference as that in this embodiment with the GND and VDD lines arranged in the same direction, the width of the GND line must be 130μ. Even if the GND line is formed of the second level interconnection line, the width thereof becomes 22μ. This requires an increased area in comparison to the layout of the present invention, resulting in an increase in chip size. In addition to this disadvantage, the average interconnection line length becomes long, resulting in the low-speed operation of the IC.

Interconnection lines running across the column are preferably formed of second level interconnection lines. The interconnection lines connected to electrodes of the FETs of the respective basic cells are formed of first level interconnection lines. Therefore, if the interconnection lines running across the column are first level interconnection lines, special consideration must be taken with respect to isolation between the electrodes of the FETs and the interconnection lines. To this end, a region for interconnection lines may be formed between the respective basic cells in the column, or the interconnection lines may be formed of the second level interconnection lines on the FETs with contact holes therebetween, and the first level interconnection lines at portions crossing the GND line. According to this layout, the area of the device is also increased. In practice, there is no GND and VDD lines of the second level interconnection lines, which are arranged in parallel with the column. Therefore, if the GND line is arranged in parallel with the column, it must be realized by the first level interconnection line and must have a width of about 130μ in order to properly operate the gate array.

It is difficult to increase the thickness of the first interconnection line on the order of several times that of the above example (i.e., Ti 500 nm, Pt 1,000 nm and Au 1,500 nm) due to the limitations of the lithography technique and planar technique. For this reason, if the conventional layout technique of the VDD and GND lines is adopted, a compact GaAs gate array cannot be operated.

To summarize this invention, since the number of columns in the gate array is smaller than that of the basic cells in each of the columns, arranging the GND line perpendicular to the columns minimizes the potential difference and enables the operation of the gate array.

For the same reason as described above, VDD lines can be formed perpendicular to the columns. However, for the same reason in the conventional technique, it is preferable that the VDD lines do not run across the interconnection tracks. In addition, since an influence of the operation margin given by the potential difference in the VDD line is not so large as that of the GND line, the VDD line is preferably arranged in parallel to the columns.

As described above, according to the present invention, a layout technique of the GND and the VDD lines for stabilizing the operation of the GaAs gate array can be provided. More particularly, the layout technique plays an important role in achieving a stable operation of the gate array of the DCFL structure. In fact, a 6×6 bit parallel multiplier which is an application of a 1,050-gate gate array according to this embodiment operated satisfactorily.

The gate array using the GaAs substrate was described above. However, a silicon substrate can be used instead of the GaAs substrate. In this case, aluminum can be used as a material of the VDD and GND lines.

What is claimed is:

1. A gate array integrated circuit device comprising:
an integrated circuit substrate;
a gate array formed in said integrated circuit substrate and having a plurality of basic cell arrays arranged parallel in columns, each of said basic cell arrays having a plurality of basic gate cells each having the shape of a rectangle a long side of which extends perpendicular to the direction of columns and is composed of Schottky barrier field effect transistors formed in said integrated circuit substrate to form gates, each of said field effect transistors having a gate electrode layer formed to extend along the long side of said basic gate cell, and said basic gate cell of each of said basic cell arrays being arrayed in columns along short sides of said basic gate cells;
a plurality of power supply lines formed of a metal layer and arranged in parallel on said gate array; and
a plurality of ground lines formed of a metal layer and arranged in parallel on said gate array, said ground lines arranged in parallel with said gate electrode layers and perpendicular to said basic cell arrays, said power supply lines and said ground lines being adapted for connection to a power supply to supply an operation voltage to each of said basic gate cells;
said power supply lines and said ground lines being arranged such that said power supply lines and said ground lines are perpendicular to each other on said gate array with an insulution layer interposed therebetween, and the number of said basic gate cells which are coupled in common to each of said powersupply lines being larger than the number of said basic gate cells which are coupled in common to each of said ground lines.

2. A circuit according to claim 1, wherein said integrated circuit substrate is a gallium arsenide substrate.

3. A circuit according to claim 1, wherein said integrated circuit substrate is a silicon substrate.

4. A circuit according to claim 1, wherein said ground lines are formed by uppermost interconnection lines.

5. A circuit according to claim 1, wherein each of said gate cells is composed of a direct-coupled field effect transistor circuit comprising a normally-on Schottky-barrier field effect transistor serving as an active load and normally-off Schottky-barrier field effect transistors serving as drivers.

6. A gate array integrated circuit device comprising:
an integrated circuit substrate;
a gate array formed on said integrated circuit substrate and having a plurality of basic cell arrays arranged parallel in columns, each of said basic cell arrays having a plurality of basic gate cells each having the shape of a rectangle a long side of which extends perpendicular to the direction of columns and is composed of Schottky barrier field effect transistors formed in said integrated circuit substrate to form gates, each of said field effect transistors having a gate electrode layer formed to extend along the long side of said basic gate cell, and said basic gate cell of each of said basic cell arrays being arrayed in columns along short sides of said basic gate cells;

a plurality of power supply lines formed of a metal layer and arranged in parallel on said gate array; and a plurality of ground lines formed of a metal layer and arranged in parallel on said gate array, said ground lines arranged in parallel with said gate electrode layers, said power supply lines and said around lines being adapted for connection to a power supply to supply an operation voltage to each of said basic gate cells;

said power supply lines and said ground lines being arranged such that said power supply lines and said ground lines are perpendicular to each other on said gate array with an insulution layer interposed therebetween, and the number of said basic gate cells which are coupled in common to each of said power supply lines being larger than the number of said basic gate cells which are coupled in common to each of said ground lines;

wherein the number of said basic gate cells in each of said basic cell arrays is larger than that of said basic cell arrays arranged in columns, each of said power supply lines is arranged along one of said basic cell arrays and each of said ground lines is arranged along corresponding basic gate cells, arranged in a row, in said basic cell arrays.

7. The gate array integrated circuit device according to claim 6, wherein each of said power supply lines is a first level interconnection line and each of said ground lines is an uppermost interconnection line which are formed on said integrated circuit substrate.

8. The gate array integrated circuit device according to claim 7, wherein each of said power supply lines and said ground lines is formed of a three-layer structure of metals.

9. The gate array integrated circuit device according to claim 8, wherein said metals are titanium, platinum and gold.

10. The gate array integrated circuit device according to claim 7, wherein said ground lines are formed thicker than said power supply lines.

11. The gate array integrated circuit device according to claim 6, wherein said substrate has a substantially square shape.

* * * * *